(12) United States Patent
Anholt et al.

(10) Patent No.: US 9,799,397 B2
(45) Date of Patent: Oct. 24, 2017

(54) MANAGEMENT OF DATA STORAGE IN MEMORY CELLS USING A NON-INTEGER NUMBER OF BITS PER CELL

(71) Applicant: Apple Inc., Cupertino, CA (US)

(72) Inventors: Micha Anholt, Tel Aviv (IL); Naftali Sommer, Rishon Le-Zion (IL)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/437,715

(22) Filed: Feb. 21, 2017

(65) Prior Publication Data
US 2017/0162258 A1 Jun. 8, 2017

Related U.S. Application Data

(62) Division of application No. 14/858,313, filed on Sep. 18, 2015, now Pat. No. 9,613,686, which is a division of application No. 14/135,823, filed on Dec. 20, 2013, now Pat. No. 9,171,624.

(51) Int. Cl.
*G11C 16/04* (2006.01)
*G11C 11/56* (2006.01)
*G11C 16/10* (2006.01)

(52) U.S. Cl.
CPC ...... *G11C 11/5628* (2013.01); *G11C 11/5642* (2013.01); *G11C 11/5671* (2013.01); *G11C 16/107* (2013.01)

(58) Field of Classification Search
CPC .................................................... G11C 16/107
USPC .................................................... 365/185.28
See application file for complete search history.

(56) References Cited

U.S. PATENT DOCUMENTS

| | | | |
|---|---|---|---|
| 8,065,583 B2 | 11/2011 | Radke | |
| 8,645,794 B1 | 2/2014 | Meir et al. | |
| 8,767,459 B1 | 7/2014 | Kasorla et al. | |
| 8,862,964 B2 | 10/2014 | Meir | |
| 2004/0066690 A1 | 4/2004 | Perner et al. | |
| 2004/0135709 A1 | 7/2004 | Cornelius et al. | |
| 2007/0047042 A1 | 3/2007 | Noguchi | |
| 2007/0171730 A1 | 7/2007 | Ramamoorthy et al. | |
| 2008/0192544 A1 | 8/2008 | Berman | |
| 2011/0047421 A1* | 2/2011 | Schuette | G11C 16/349 714/718 |

(Continued)

FOREIGN PATENT DOCUMENTS

WO 2008069385 6/2008

OTHER PUBLICATIONS

International Search Report and Written Opinion from PCT/US2014/058162, issued Dec. 9, 2014, Apple Inc., pp. 1-10.

(Continued)

*Primary Examiner* — Hoai V Ho
(74) *Attorney, Agent, or Firm* — Meyertons, Hood, Kivlin, Kowert & Goetzel, P.C.

(57) ABSTRACT

A method for data storage includes storing data in a group of memory cells, by encoding the data using at least an outer code and an inner code, and optionally inverting the encoded data prior to storing the encoded data in the memory cells. The encoded data is read from the memory cells, and inner code decoding is applied to the read encoded data to produce a decoding result. At least part of the read data is conditionally inverted, depending on the decoding result of the inner code.

20 Claims, 4 Drawing Sheets

(56) References Cited

U.S. PATENT DOCUMENTS

2014/0003143 A1 1/2014 Radke
2015/0348633 A1 12/2015 Song

OTHER PUBLICATIONS

International Preliminary Report on Patentability and Written Opinion from PCT/US2014/058162, issued Jun. 30, 2016, Apple Inc.

* cited by examiner

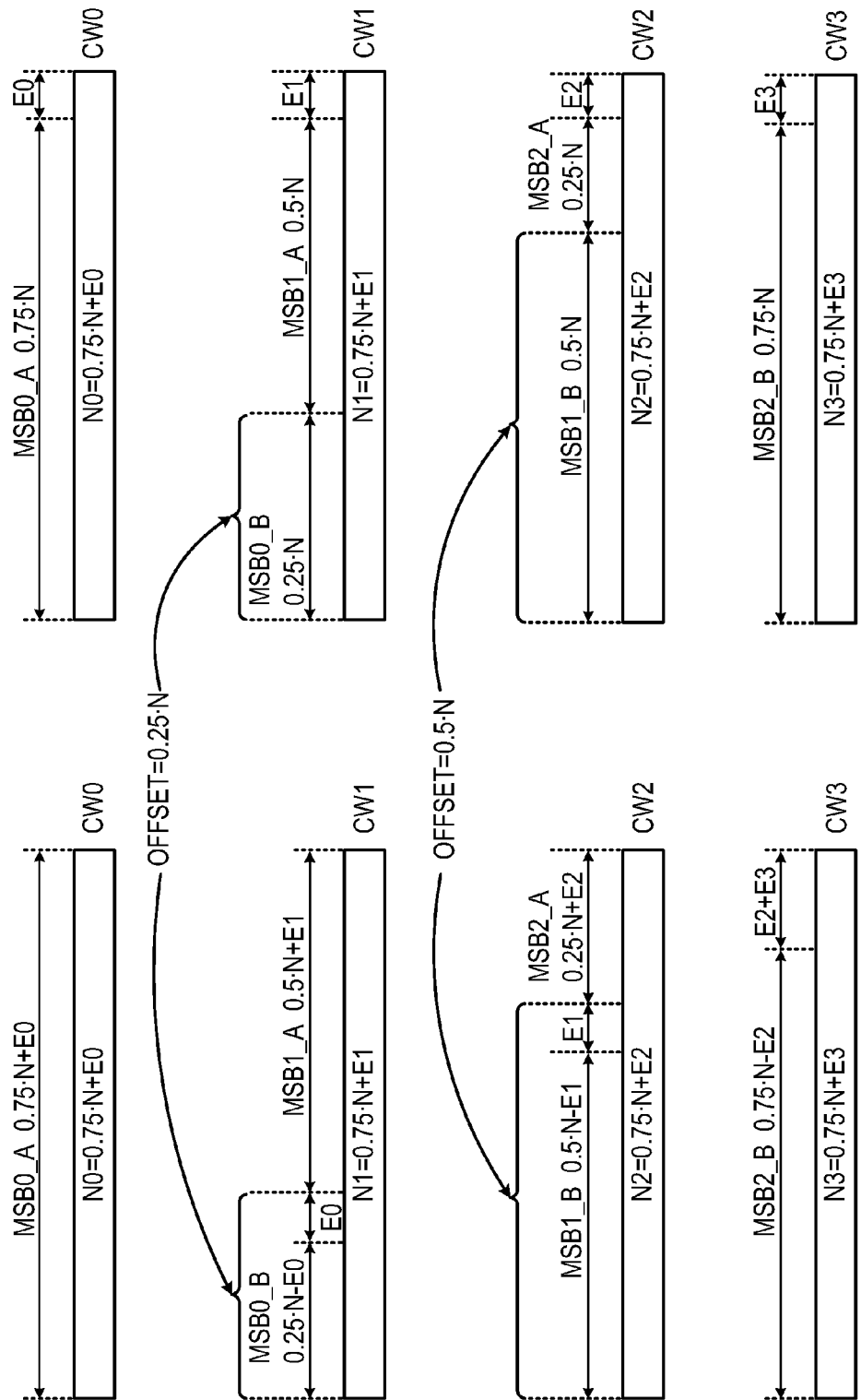

US 9,799,397 B2

MANAGEMENT OF DATA STORAGE IN MEMORY CELLS USING A NON-INTEGER NUMBER OF BITS PER CELL

PRIORITY INFORMATION

This application is a divisional of U.S. patent application Ser. No. 14/858,313, entitled "Management of Data Storage in Memory Cells Using a Non-Integer Number of Bits Per Cell," filed Sep. 18, 2015, which is a divisional of U.S. patent application Ser. No. 14/135,823, filed Dec. 20, 2013, now U.S. Pat. No. 9,171,624, which is hereby incorporated by reference in its entirety as though fully and completely set forth herein.

CROSS-REFERENCE TO RELATED APPLICATIONS

This application is related to U.S. patent application Ser. No. 14/135,881, entitled "Storage Management in Memory cells using a Non-Integer Number of Bits Per Cell," filed Dec. 20, 2013, now U.S. Pat. No. 9,230,655, whose disclosure is incorporated herein by reference.

TECHNICAL FIELD

The embodiments disclosed herein relate generally to data storage, and particularly to methods and systems for storing data in memory cells.

BACKGROUND

Several types of memory devices, such as Flash memories, use arrays of memory cells for storing data. Each memory cell stores a quantity of an analog value, also referred to as a storage value, such as an electrical charge or voltage. This analog value represents the information stored in the cell. In Flash memories, for example, each memory cell holds a certain amount of electrical charge. The range of possible analog values is typically divided into intervals, each interval corresponding to one or more data bit values. Data is written to an memory cell by writing a nominal analog value that corresponds to the desired bit or bits.

Some memory devices, commonly referred to as Single-Level Cell (SLC) devices, store a single bit of information in each memory cell, i.e., each memory cell can be programmed to assume two possible programming levels. Higher-density devices, often referred to as Multi-Level Cell (MLC) devices, store two or more bits per memory cell, i.e., can be programmed to assume more than two possible programming levels. As an example, a Triple-Level Cell (TLC) device, stores three bits per cell using eight programming levels.

Flash memory devices are described, for example, by Bez et al., in "Introduction to Flash Memory," Proceedings of the IEEE, volume 91, number 4, April, 2003, pages 489-502, which is incorporated herein by reference. Multi-level Flash cells and devices are described, for example, by Eitan et al., in "Multilevel Flash Cells and their Trade-Offs," Proceedings of the 1996 IEEE International Electron Devices Meeting (IEDM), New York, N.Y., pages 169-172, which is incorporated herein by reference. The paper compares several kinds of multilevel Flash cells, such as common ground, DINOR, AND, NOR and NAND cells.

Eitan et al., describe another type of memory cell called Nitride Read Only Memory (NROM) in "Can NROM, a 2-bit, Trapping Storage NVM Cell, Give a Real Challenge to Floating Gate Cells?" Proceedings of the 1999 International Conference on Solid State Devices and Materials (SSDM), Tokyo, Japan, Sep. 21-24, 1999, pages 522-524, which is incorporated herein by reference. NROM cells are also described by Maayan et al., in "A 512 Mb NROM Flash Data Storage Memory with 8 MB/s Data Rate," Proceedings of the 2002 IEEE International Solid-State Circuits Conference (ISSCC 2002), San Francisco, Calif., Feb. 3-7, 2002, pages 100-101, which is incorporated herein by reference. Other exemplary types of memory cells are Floating Gate (FG) cells, Ferroelectric RAM (FRAM) cells, magnetic RAM (MRAM) cells, Charge Trap Flash (CTF) and phase change RAM (PRAM, also referred to as Phase Change Memory—PCM) cells. FRAM, MRAM and PRAM cells are described, for example, by Kim and Koh in "Future Memory Technology including Emerging New Memories," Proceedings of the $24^{th}$ International Conference on Microelectronics (MIEL), Nis, Serbia and Montenegro, May 16-19, 2004, volume 1, pages 377-384, which is incorporated herein by reference.

Some storage schemes store data at a density having a non-integer number of bits per memory cell. For example, U.S. Pat. No. 7,071,849, whose disclosure is incorporated herein by reference, describes fractional-bit systems that allow increments of the number of states per cell by as little as one between product generations. Since the number of states per cell is not an integer power of two, the number of bits per cell takes a fractional value. Cells are typically decoded in units of word, and the system efficiency can be optimized by adjusting the word-width.

As another example, U.S. Pat. No. 6,646,913, whose disclosure is incorporated herein by reference, describes a method for storing and reading data in a multilevel non-volatile memory having a memory array formed by a plurality of memory cells. Each of the memory cells stores a number of bits that is not an integer power of two. In this way, one data byte is stored in a non-integer number of memory cells. The managing method includes storing, in the same clock cycle, a data word formed by a plurality of bytes, by programming a preset number of adjacent memory cells. Reading is performed by reading the stored data word in the same clock cycle.

The method described in U.S. Pat. No. 7,167,109, whose disclosure is incorporated herein by reference, allows increments of the number of states-per-cell N by as little as 1 between product generations. Because N is no longer an integral power of two, b takes a fractional value, resulting in a fractional-bit system. In a fractional-bit system, cells are decoded in units of word. By adjusting the word-width, the system efficiency can be optimized. Hybrid N-ary system can be used to improve manufacturing yield and endurance lifetime.

U.S. Pat. No. 7,742,335, whose disclosure is incorporated herein by reference, describes methods, devices, modules, and systems for operating non-volatile multilevel memory cells. One method embodiment includes assigning, to a first cell coupled to a row select line, a first number of program states to which the first cell can be programmed. The method further includes assigning, to a second cell coupled to the row select line, a second number of program states to which the second cell can be programmed, wherein the second number of program states is greater than the first number of program states. The method includes programming the first cell to one of the first number of program states prior to programming the second cell to one of the second number of program states.

U.S. Pat. No. 7,848,142, whose disclosure is incorporated herein by reference, describes methods, devices, modules, and systems for programming memory cells that can include storing charges corresponding to a data state that represents an integer number of bits in a set of memory cells. Programming memory cells can include storing a charge in a cell of the set, where the charge corresponds to a programmed state, where the programmed state represents a fractional number of bits, and where the programmed state denotes a digit of the data state as expressed by a number in base N, where N is equal to $2^B$, rounded up to an integer, and where B is equal to the fractional number of bits represented by the programmed state.

U.S. Pat. No. 7,420,841, whose disclosure is incorporated herein by reference, describes a memory device and a method of operating a memory device. In one embodiment of the invention, the memory device includes a plurality of multi-level memory cells each having a number m of levels not matching $2^n$ with n being a non-zero integer, and a circuit or device for combining the levels of at least two of the memory cells for write and read operations into a set of combined states and for transforming at least a subset of $2^n$ combinations of the set of combined states into n two-level data bits.

SUMMARY

An embodiment that is described herein provides a method for data storage, including storing data in a group of memory cells by encoding the data using at least an outer code and an inner code, and optionally inverting the encoded data prior to storing the encoded data in the memory cells. The encoded data is read from the memory cells. Inner code decoding is applied to the read encoded data to produce a decoding result. At least part of the read data is conditionally inverted depending on the decoding result of the inner code.

In some embodiments, the inner code includes a code in which inversion of a valid code word does not always result in another valid code word, and applying the inner code decoding includes decoding at least one of the read encoded data and an inverted version of the read encoded data. In other embodiments, applying the inner code decoding includes decoding both the read encoded data and the inverted version of the read encoded data, and conditionally inverting the at least part of the read data includes inverting the at least part of the read data only when the decoding result of the inverted version is error free and the decoding result of the read encoded data is not error free.

In yet other embodiments, storing the data includes storing with relation to the data an inversion indication of whether the stored data has been inverted, reading the encoded data includes reading and decoding the inversion indication, and applying the inner code decoding includes decoding only the read encoded data or only the inverted version of the read encoded data, depending on the inversion indication.

In an embodiment, conditionally inverting the at least part of the read data includes indicating inability to decide whether to invert the read data when the decoding result of the read encoded data contradicts the inversion indication. In another embodiment, the inner code includes an error detection code, and conditionally inverting the at least part of the read data includes inverting the at least part of the read data when the decoding result is equal to a result of applying the inner code decoding to an all-ones word, and not inverting the at least part of the read data when the decoding result is error free.

In yet another embodiment, conditionally inverting the at least part of the read data includes indicating inability to decide whether to invert the read data or not, when the decoding result of the read encoded data contradicts the decoding result of the inverted version of the read encoded data.

There is additionally provided, in accordance with an embodiment, apparatus including a memory, which includes an array of memory cells, and storage circuitry. The storage circuitry is configured to store data in a group of the memory cells, by encoding the data using at least an outer code and an inner code and optionally inverting the encoded data prior to storing the encoded data in the memory cells, to read the encoded data from the memory cells, to apply inner code decoding to the read encoded data to produce a decoding result, and to conditionally invert at least part of the read data depending on the decoding result of the inner code.

There is additionally provided, in accordance with an embodiment, a method for data storage including, in a first programming phase, storing first data in a group of memory cells by programming the memory cells in the group to a set of initial programming levels. In a second programming phase that is subsequent to the first programming phase, second data is stored in the group by identifying the memory cells in the group that were programmed in the first programming phase to respective levels in a predefined partial subset of the initial programming levels. Only the identified memory cells are programmed with the second data, so as to set at least some of the identified memory cells to one or more additional programming levels that are different from the initial programming levels. The memory cells to which the second data was programmed are recognized by reading only a partial subset of the first data. The second data is read from the recognized memory cells.

In some embodiments, storing the first data includes storing multiple data pages, and recognizing the memory cells includes reading only a partial subset of the multiple pages. In other embodiments, storing the first data includes storing a Least Significant Bit (LSB) page and a Central Significant Bit (CSB) page, and storing the second data includes storing a Most Significant Bit (MSB) page, and recognizing the memory cells includes reading only the LSB page or the CSB page. In yet other embodiments, reading the LSB page or the CSB page includes reading the LSB page or the CSB page using a single read command. In further yet other embodiments, reading the second data includes reading the MSB page from the recognized memory cells using two reading thresholds. There is additionally provided, in accordance with an embodiment, apparatus for data storage including a memory, which includes an array of memory cells, and storage circuitry. The storage circuitry is configured to store first data in a group of the memory cells in a first programming phase by programming the memory cells in the group to a set of initial programming levels, and, in a second programming phase that is subsequent to the first programming phase, to store second data in the group by identifying the memory cells in the group that were programmed in the first programming phase to respective levels in a predefined partial subset of the initial programming levels, and programming only the identified memory cells with the second data, so as to set at least some of the identified memory cells to one or more additional programming levels that are different from the initial programming levels, to recognize the memory cells to which the second data was programmed, by reading only a partial subset of the first data, and to read the second data from the recognized memory cells.

There is additionally provided, in accordance with an embodiment, a method for data storage, including, in a group of memory cells, identifying an expected number of the memory cells in the group that are to be programmed to a given programming state. A separation between the given programming state and a neighboring programming state is set depending on the expected number of the memory cells to be programmed to the given programming state. The memory cells in the group are programmed using the set separation.

In some embodiments, the neighboring programming state is created by splitting the given programming state according to a predefined splitting ratio, and identifying the expected number of the memory cells includes evaluating the number of the memory cells programmed to the given programming level using the splitting ratio. In other embodiments, programming the memory cells includes setting the memory cells to multiple memory states, such that respective separations between neighboring memory states are non-uniform.

There is additionally provided, in accordance with an embodiment, apparatus for data storage including a memory, which includes an array of memory cells, and storage circuitry. The storage circuitry is configured to identify in a group of the memory cells an expected number of the memory cells in the group that are to be programmed to a given programming state, to set a separation between the given programming state and a neighboring programming state depending on the expected number of the memory cells to be programmed to the given programming state, and to program the memory cells in the group using the set separation.

There is additionally provided, in accordance with an embodiment, a method for data storage, including, in a first programming phase, storing first data in multiple groups of memory cells by programming the memory cells in each group to a respective set of initial programming levels. In a second programming phase that is subsequent to the first programming phase, second data is stored in the multiple groups by identifying available memory cells in each group that were programmed in the first programming phase to respective levels in a predefined partial subset of the initial programming levels. Only the identified available memory cells are programmed with the second data, such that the second data of a given group is programmed starting from a fixed location in the groups of the memory cells regardless of variations in the actual number of the available memory cells, so as to set at least some of the available memory cells to one or more additional programming levels that are different from the initial programming levels.

In some embodiments, the method includes reading the second data of the given group by accessing the memory cells at the fixed location. In other embodiments, the second data includes multiple data words, and the size of each data word is larger than the actual number of the available cells in each of the multiple groups of the memory cells. In yet other embodiments, reading the second data includes reading a given data word of the multiple data words by reading the first data only from one or more groups of the memory cells in which the given data word was programmed.

In an embodiment, the method includes programming the un-programmed memory cells with third data when programming the identified available cells with the second data leaves one or more of the identified available cells un-programmed. In another embodiment, the second data includes multiple data words whose data-word size does not exceed the number of available memory cells in each of the multiple groups of memory cells.

There is additionally provided, in accordance with an embodiment, apparatus for data storage, including a memory, which includes an array of memory cells, and storage circuitry. The storage circuitry is configured to store first data in multiple groups of the memory cells in a first programming phase by programming the memory cells in each group to a respective set of initial programming levels, and, in a second programming phase that is subsequent to the first programming phase, to store second data in the multiple groups by identifying available memory cells in each group that were programmed in the first programming phase to respective levels in a predefined partial subset of the initial programming levels, and programming only the identified available memory cells with the second data, such that the second data of a given group is programmed starting from a fixed location in the groups of the memory cells regardless of variations in the actual number of the available memory cells, so as to set at least some of the available memory cells to one or more additional programming levels that are different from the initial programming levels.

The present disclosure will be more fully understood from the following detailed description of the embodiments thereof, taken together with the drawings in which:

BRIEF DESCRIPTION OF THE DRAWINGS

FIGS. 4A and 4B are diagrams that schematically illustrate two techniques for storing data at known offsets among available memory cells, in accordance with embodiments of the present invention;

DETAILED DESCRIPTION OF EMBODIMENTS

Overview

Figure 1:
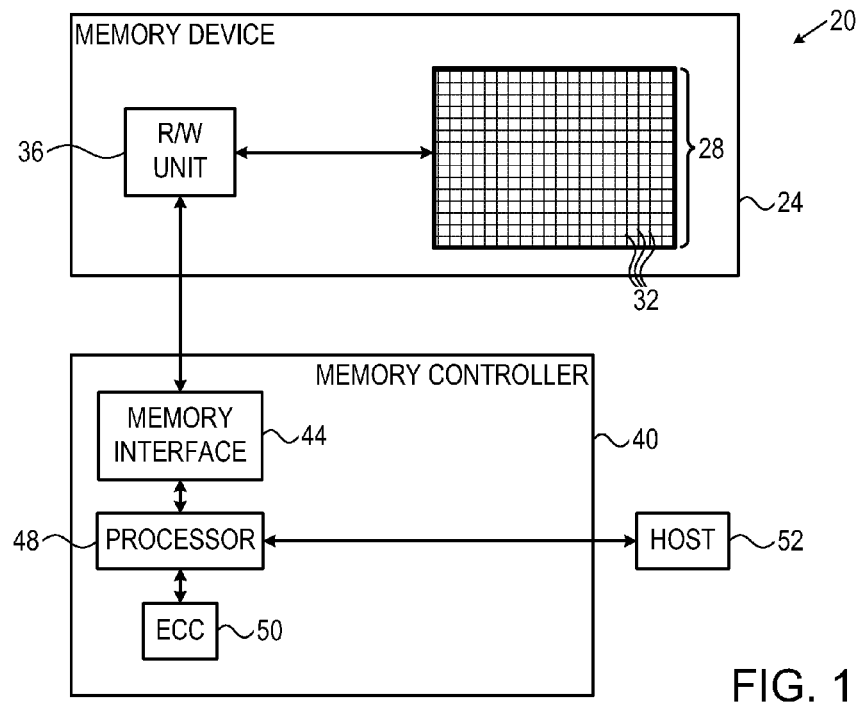
FIG. 1 is a block diagram that schematically illustrates a memory system, in accordance with an embodiment of the present invention.

Storing data using a non-integer number of bits per cell can be advantageous over using an integer number, since it enables to improve the storage density or reliability, using an increased or decreased number of programming levels, respectively, without limiting the total number of levels to be an integer power of two.

Embodiments of the present invention provide improved methods and systems for managing the storage of data using a non-integer number of bits per memory cell. The disclosed embodiments employ several variants of a two-phase programming scheme. Various examples of such two-phase programming schemes are described, for example, in U.S.

patent application Ser. No. 13/192,501, filed Jul. 28, 2011, which is assigned to the assignee of the present patent application and whose disclosure is incorporated herein by reference. In such schemes, in the first programming phase the memory cells are programmed using a number of programming levels that is an integer power of two. In the second programming phase, an additional bit is stored only in cells that were each programmed in the first phase to a level in a group of one or more selected levels. These cells are suitable for programming in the second phase and are also referred to herein as "available cells".

The exact number of available cells is data-dependent and therefore variable. Therefore, in some embodiments, data pages that are written in the first phase are optionally bit-flipped (i.e., the polarity of the bits is inverted) to ensure sufficient number of available cells for storing the second-phase data. Bit-flipping, however, may be problematic when the data is subjected to an error correction and/or error detection codes, in which an inverted valid code word is not necessarily also a valid code word. Examples of codes that do not guarantee mapping of each inverted code word to another valid code word include Cyclic Redundancy Code (CRC) and Bose-Chaudhuri-Hocquenghem (BCH). In an embodiment, a coding scheme employs inner and outer codes. The inner code (e.g., CRC or BCH) may be used in conjunction with the outer code (e.g., Low Density Parity Check—LDPC), for example, to recognize conditions for early termination of the iterative LDPC decoder or for resolving trapping-set scenarios. In some embodiments, the polarity of the stored code word is indicated by a respective inversion bit, which is typically (although not necessarily) embedded in the code word.

In an embodiment, the inner code comprises an error detecting code such as CRC code (or BCH code in error detection mode). Data is read from the memory cells, the outer code is decoded, and CRC decoding is applied (possibly in parallel to the outer decoder) to both the data read and to the same data inverted. The polarity is determined based on whether either of the CRC decoding indicates that no errors were found, (and possibly on the inversion bit). In another embodiment, CRC decoding is applied only once, according to the polarity of the inversion bit in the read data. In yet another embodiment, the outcome of the CRC decoder is compared to both a zero word (indicating no inversion) and to a word, which is equal to the CRC applied to an all-ones word (indicating that inversion was applied). In yet further another embodiment, the inner code comprises an error correction code, such as a BCH code (configured to error correction operating mode), and decoding is applied to both the read data and to the same data inverted. The polarity of the code word is determined according to whether the outcome of any of the two BCH decoders is decodable, i.e., is error free.

In some embodiments, each memory cell is programmed in the first phase (of the above-mentioned two-phase programming scheme) to assume one of four initial levels, two of which are selected for the second phase. In the second phase, an additional bit is written only to cells that were programmed to one of the two selected levels. The cell occupancies of the selected levels are thus split in about half in the second phase, resulting in a total number of six levels, of which four are approximately half populated. Since according to this scheme half of the cells store 3 bits/cell and the other half store 2 bits/cell, the device stores an average number of 2.5 bits/cell.

In the disclosed embodiments, which employ a six-level programming scheme as described above, dedicated schemes for mapping three-bit combinations to programming levels are designed to enable identification of cells programmed in the second phase without the need to read the entire data programmed in the first phase. In one embodiment, identifying the cells is performed by reading only the central significance bit (CSB) page using two read thresholds. In another embodiment, identifying the cells involves reading only the least significant (LSB) bit page using a single read threshold. The disclosed techniques thus refrain from unnecessary operations of read and decode.

In some embodiments, instead of uniform level spacing, the threshold-voltage spacing among the programming levels is determined based on the cell occupancy of the levels. In such embodiments, the spacing or separation between adjacent levels that are less occupied is set closer than the spacing between adjacent levels that are highly occupied. Such non-uniform spacing may be used, for example, to achieve uniform read error probability across all the levels.

In some embodiments, N-bit sized words (e.g., N-bit code words of encoded data) are written to groups of N cells, which are also referred to as cell-groups. In such embodiments, optional bit inversion is applied prior to storing in the first phase to ensure sufficient level occupancy (i.e., sufficient number of available cells) in the second phase, as described above. If in addition, three levels (out of four levels used in the first phase) are split in the second phase, only about ¾ of the cells in each cell-group are available for storing an additional bit. In some embodiments, three N-bit code words are stored among the available cells of four cell-groups. Each code word is divided into two segments, which are written in two separate cell-groups at certain fixed offsets among the available cells.

In an example embodiment, the segments of the code words are written in sequence, using up all the available cells. In this embodiment, the offset among the available cells in which each segment is written is data dependent. To read a code word, the offsets of the respective segments are evaluated by reading data from at least cell-groups in which none of the respective segments are written.

In other embodiments, the segments of the code words are written at known fixed offsets among the available cells in each cell-group. By using fixed offsets, reading the segments of a given code word requires reading data only from the cell-groups in which the segments of that code word are written. The read segments are then combined to recover the original code word. Using known offsets thus enables to refrain from unnecessary operations of read and decode.

In other embodiments, the data-size in the second phase is selected to fit the minimal number of available cells in the cell-groups, and therefore simplifies the operations of data read and write. In such embodiments, however, separate different coding schemes may be required for the first and second programming phases, thus making the overall coding scheme more complex.

System Description

FIG. 1 is a block diagram that schematically illustrates a memory system 20, in accordance with an embodiment of the present invention. System 20 can be used in various host systems and devices, such as in computing devices, cellular phones or other communication terminals, removable memory modules (e.g., "disk-on-key" or "Flash drive" devices), Solid State Disks (SSD), digital cameras, music and other media players and/or any other system or device in which data is stored and retrieved.

System 20 comprises a memory device 24, which stores data in a memory cell array 28. The memory array comprises multiple memory cells 32. In the context of the present patent application and in the claims, the term "memory cell" is used to describe any memory cell that holds a continuous, analog value of a physical parameter, such as an electrical voltage or charge. Array 32 may comprise solid-state memory cells of any kind, such as, for example, NAND, NOR and Charge Trap Flash (CTF) Flash cells, phase change RAM (PRAM, also referred to as Phase Change Memory—PCM), Nitride Read Only Memory (NROM), Ferroelectric RAM (FRAM), magnetic RAM (MRAIVI) and/or Dynamic RAM (DRAM) cells. Although the embodiments described herein refer mainly to analog memory, the disclosed techniques may also be used with various other memory types.

The charge levels stored in the cells and/or the analog voltages or currents written into and read out of the cells are referred to herein collectively as analog values, storage values or analog storage values. Although the embodiments described herein mainly address threshold voltages, the methods and systems described herein may be used with any other suitable kind of storage values.

System 20 stores data in the memory cells by programming the cells to assume respective memory states, which are also referred to as programming levels. The programming levels are selected from a finite set of possible levels, and each level corresponds to a certain nominal storage value. For example, a 2 bit/cell MLC can be programmed to assume one of four possible programming levels by writing one of four possible nominal storage values into the cell. The techniques described herein mainly address storage densities of a non-integer number of bits per memory cell, i.e., a number of programming levels that is not an integer power of two.

Memory device 24 comprises a reading/writing (R/W) unit 36, which converts data for storage in the memory device to analog storage values and writes them into memory cells 32. In alternative embodiments, the R/W unit does not perform the conversion, but is provided with voltage samples, i.e., with the storage values for storage in the cells. When reading data out of array 28, R/W unit 36 converts the storage values of memory cells 32 into digital samples having an integer resolution of one or more bits. Data is typically written to and read from the memory cells in groups that are referred to as pages. In some embodiments, the R/W unit can erase a group of cells 32 by applying one or more negative erasure pulses to the cells.

The storage and retrieval of data in and out of memory device 24 is performed by a memory controller 40. Memory controller 40 comprises an interface 44 for communicating with memory device 24, a processor 48, and an Error Correcting Code (ECC) unit 50. The disclosed techniques can be carried out by memory controller 40, by R/W unit 36, or both. Thus, in the present context, memory controller 40 and R/W unit 36 are referred to collectively as storage circuitry that carries out the disclosed techniques.

Memory controller 40 communicates with a host 52, for accepting data for storage in the memory device and for outputting data retrieved from the memory device. ECC unit 50 encodes the data for storage using a suitable ECC and decodes the ECC of data retrieved from the memory. Any suitable type of ECC, such as, for example, Low Density Parity Check (LDPC), Reed-Solomon (RS) or Bose-Chaudhuri-Hocquenghem (BCH), can be used. In some embodiments, in addition to comprising an error correcting code, ECC unit 50 further comprises another (typically smaller) error correcting or error detecting code. Example codes that may be used for such additional code include BCH for error correction and Cyclic Redundancy Code (CRC) for error detection. The output of ECC unit 50 in the encode direction is also referred to as a "code word."

Memory controller 40 may be implemented in hardware, e.g., using one or more Application-Specific Integrated Circuits (ASICs) or Field-Programmable Gate Arrays (FPGAs). Alternatively, the memory controller may comprise a microprocessor that runs suitable software, or a combination of hardware and software elements.

The configuration of FIG. 1 is an example system configuration, which is shown purely for the sake of conceptual clarity. Any other suitable memory system configuration can also be used. For example, although the example of FIG. 1 shows a single memory device, in alternative embodiments memory controller 40 may control multiple memory devices 24. Elements that are not necessary for understanding the principles of the present invention, such as various interfaces, addressing circuits, timing and sequencing circuits and debugging circuits, have been omitted from the figure for clarity.

In the example system configuration shown in FIG. 1, memory device 24 and memory controller 40 are implemented as two separate Integrated Circuits (ICs). In alternative embodiments, however, the memory device and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which the memory array is disposed. Further alternatively, some or all of the functionality of memory controller 40 can be implemented in software and carried out by a processor or other element of the host system. In some embodiments, host 44 and memory controller 40 may be fabricated on the same die, or on separate dies in the same device package.

In some embodiments, memory controller 40 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

In an example configuration of array 28, memory cells 32 are arranged in multiple rows and columns, and each memory cell comprises a floating-gate transistor. The gates of the transistors in each row are connected by word lines, and the sources of the transistors in each column are connected by bit lines. In the present context, the term "row" is used in the conventional sense to mean a group of memory cells that are fed by a common word line, and the term "column" means a group of memory cells fed by a common bit line. The terms "row" and "column" do not connote a certain physical orientation of the memory cells relative to the memory device. The memory array is typically divided into multiple memory pages, i.e., groups of memory cells that are programmed and read simultaneously.

In some embodiments, memory pages are sub-divided into sectors. Pages may be mapped to word lines in various manners. Each word line may store one or more pages. A given page may be stored in all the memory cells of a word line, or in a subset of the memory cells (e.g., the odd-order or even-order memory cells).

Erasing of cells is usually carried out in blocks that contain multiple pages. Typical memory devices may comprise thousands of erasure blocks. In a typical two-bit-per-cell MLC device, each erasure block is on the order of 32 word lines, each comprising several tens of thousands of cells. Each word line of such a device is often partitioned into four pages (odd/even order cells, least/most significant bit of the cells). Three-bit-per cell devices having 32 word lines per erasure block would have 192 pages per erasure block, and four-bit-per-cell devices would have 256 pages per block. Alternatively, other block sizes and configurations can also be used. Some memory devices comprise two or more separate memory cell arrays, often referred to as planes. Since each plane has a certain "busy" period between successive write operations, data can be written alternately to the different planes in order to increase programming speed.

Storing Data Using a Non-Integer Number of Bits Per Cell

Storing data using a non-integer number of bits per cell is equivalent to programming the memory cells to assume programming levels or states whose number is not an integer power of two. In some embodiments, system 20 employs a two-phase programming scheme to store the data using a non-integer number of bits per cell.

In the first phase, the memory cells are programmed using a number of programming levels that is an integer power of two. For example, in a TLC device, the cells are first programmed using only four levels (out of the eight possible levels). In the second phase, only cells that were programed in the first phase to certain levels among the first phase levels may be programmed with an additional bit. In the eight-level TLC example, the first phase levels, which are selected for programming in the second phase, comprise a group of one, two, or three levels, resulting in a total number of five, six, or seven levels, respectively.

In the second phase, the value ("0" or "1") of the additional bit determines whether the respective cell retains the programming level to which the cell was programmed in the first phase, or programmed to another, typically higher, programming level, which differs from all the levels of the first phase. Thus, a programming level, which was populated with a given number of cells in the first phase, is split in the second phase approximately in half, assuming similar "0" and "1" bit prevalence. Various examples of such two-phase programming schemes are described, for example, in U.S. patent application Ser. No. 13/192,501, cited above.

In some embodiments, the data to be programmed comprises separate data pages, e.g., pages of orderly bit significance. The storage circuitry stores the pages of bit significance lower than the highest (or most) significant bit in the first phase, and only the most significant data page in the second phase. For example, in a TLC device, the storage circuitry stores Least Significant Bit (LSB) and Central Significant Bit (CSB) pages in the first phase. Then, based on the data stored in the first phase, the storage circuitry stores a Most Significant Bit (MSB) page during the second phase. Examples of first and second phase programming levels, level splitting, and mapping schemes of bit combinations to programming levels are described below with relation to FIGS. 3A and 3B.

Methods for Decoding Inverted Code Words

When programming data in the second phase (e.g., MSB data), the aggregated number of cells that populate the programming levels to be split is data dependent, and may be found insufficient. In some embodiments, the bit polarity of the data pages written in the first phase is optionally inverted to ensure sufficient cell population of the levels to be split in the second phase. When, in addition, the data is subject to error correction coding, conventional decoding of the inverted data may not be feasible since the inverted data may not comprise a valid code word.

To increase storage reliability, in some embodiments, the storage circuitry protects the data to be programmed using a suitable encoding scheme, which is typically implemented by ECC unit 50.

Figure 2:
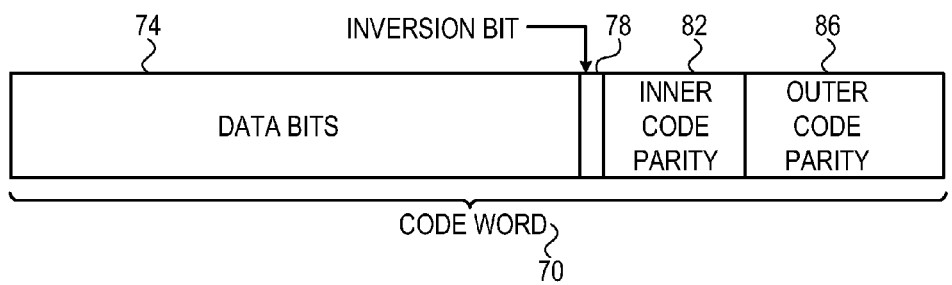
FIG. 2 is a diagram that schematically illustrates a data code word, in accordance with an embodiment of the present invention.

FIG. 2 is a diagram that schematically illustrates a code word 70, in accordance with an embodiment of the present invention. In the example of FIG. 2, code word 70 comprises data bits 74 (e.g., LSB or CSB data in the first phase), an inversion bit 78, inner code parity bits 82, and outer code parity bits 86. In the present example, parity bits 86 comprise a LDPC code, which ECC unit 50 applies together to data bits 74, inversion bit 78, and inner code parity bits 82. Thus, the aggregation of data bits 74, inversion bit 78, inner code parity bits 82, and outer code parity bits 86 comprises a LDPC code word. Further in the example of FIG. 2, parity bits 82 comprise a CRC or BCH code, which ECC unit 50 applies data bits 74 and to inversion bit 78. In the described configuration, the LDPC outer code can correct errors in inner code parity bits 82, which enables to use the inner code for early termination of the LDPC decoding iterations, or for clearing residual errors following outer decoding, as explained below.

The configuration of FIG. 2 is an exemplary configuration, which is shown purely for the sake of conceptual clarity, and other suitable configurations can also be used. For example, other suitable codes, coding schemes, and sizes and ordering of the different elements of code word 70, can also be used.

In some embodiments, inner code 82 (e.g., comprising a CRC or BCH code) can be used, for example, in conjunction with LDPC code 86, to recognize conditions for early termination while iteratively decoding the LDPC code word, or to detect and mitigate trapping-set scenarios in the LDPC decoder. As another example, when the inner code comprises an error correcting code (e.g., BCH), code 82 can be used for mitigating residual errors ("error floor") remaining at the output of the LDPC decoder. U.S. patent application Ser. No. 12/913,815, filed Oct. 28, 2010, which is assigned to the assignee of the present patent application and whose disclosure is incorporated herein by reference, describes several methods for performing early termination during iterative decoding. In some embodiments, the storage circuitry initially sets inversion bit 78 to "0", and optionally inverts or bit-flips the entire code word 70 to ensure sufficient level population of cells in the levels to be split as described above. When reading the data, the storage circuitry retrieves the code word from array 28, and applies decoding using ECC unit 50. If decoded bit inversion 78 equals "1" the storage circuitry flips the data bits of the code word back, before delivery of bits 74 to the host. For the decoding to work properly, however, each inverted code word should also comprise a valid code word. In other words, each valid code word of the coding scheme should be mapped by inversion to another valid code word. By including the requirement that each row of the parity check matrix of the code has an even weight (i.e., the row comprises an even number of non-zero elements), LDPC codes can be designed to support the property that for each valid code word, bit-flipping results in another valid code word. This property, however, is hard or impossible to achieve in CRC and BCH codes. In the description that follows, we assume that the outer code (e.g. LDPC) supports the abovementioned property of the validity of inverted valid code words.

We now describe several methods for decoding code word 70, and deciding whether it was inverted before storing and therefore should be inverted back. In the disclosed embodiments, inner code 82 comprises a code that does not guarantee the validity of respective bit-flipped code words. In the description that follows X denotes a CRC or BCH code word. For example X may comprise data bits 74, inversion bit 78, and parity bits 82. Additionally, let ~X denote the bit-flipped version of X, and CRC(X) or BCH(X) denote the decoding operation. Also, ZEROS and ONES denote all-"0" and all-"1" bit sequences, respectively. In the context of the present patent application and in the claims, inner code decoding refers to both error detection and error correction codes.

We first describe several embodiments in which inner code 82 comprises an error detection code. Although the description mainly relates to embodiments that employ CRC coding, any other suitable error detection codes can also be used, such as, for example, a BCH code that is configured to operate in error detection mode. According to a property of error detection codes, if X is error free then CRC(X)= ZEROS, and on the other hand, the probability that applying CRC decoding to an erroneous code word should result in ZEROS is very low.

In one embodiment, ECC unit 50 applies two CRC decode operations, namely CRC(X) and CRC(~X)(possibly in parallel). If CRC(X)=ZEORS, the storage circuitry regards code word 70 as stored un-inverted. If on the other hand CRC(~X)=ZEROS, code word 70 is assumed inverted. Otherwise (i.e., when none of the two CRC decoders produce the ZEROS result), the criteria for early termination of the LDPC iterative decoder is not yet fulfilled.

In another embodiment, ECC unit 50 performs only one CRC decoding based on the value of inversion bit 78. If the inversion bit indicates no inversion ("0"), ECC unit 50 decodes CRC(X). Otherwise the bit indicates that the code word was inverted and ECC unit 50 decodes CRC(~X). ECC unit 50 may perform early termination of the LDPC decoding iterations if the respective CRC decoding result equals ZEORS.

In yet another embodiment, the decoding scheme relies on the inner code being a linear code. According to the linearity property, CRC(~X+ONES)=CRC(~X)+CRC(ONES), wherein "+" denotes bitwise XOR. Since, however, X=~X+ ONES, we conclude that ZEROS=CRC(X)=CRC(~X)+ CRC(ONES). In the example embodiment, ECC unit 50 performs CRC decoding and checks whether the result is equal to CRC(ONES) or to ZEORS, to identify whether the code word was inverted, or not, respectively. Note that for each different inner code, the value CRC(ONES) needs to be pre-calculated and stored only once.

In the embodiments described above, ECC unit 50 may (on rare occasions) encounter a conflict between the result of the CRC(·) decoding and the decoded value of bit inversion 78. Additionally, the outcomes of applying CRC(X) and CRC(~X) may not always result in a conclusive decision whether to invert the read data or not. In such occurrences, ECC unit is provided with a suitable indication. ECC unit 50 may use any suitable decoding method when such a conflict or inconclusive conclusion occurs. For example, ECC unit 50 may decide not to terminate the LDPC iterative decoder.

Some of the embodiments that are described above in the context of error detection codes are applicable to error correction codes as well.

We now describe an embodiment, in which inner code 82 comprises an error correction code such as BCH (configured to error correction operating mode). ECC unit 50 applies two decoding operations, namely BCH(~X) and BCH(X). If only one of ~X or X is decodable, i.e., decodes an error-free result, the storage circuitry regards code word 70 as bit-flipped, or not, respectively. If both ~X and X are decodable, or both fail to generate an error free result, then some other criterion can be used to determine the inversion status, for example, based on the one having (following decoding) the least number of errors. Other criteria include, for example, consistency with the inversion bit after decoding, or the weight of the error pattern. In Alternative embodiments, ECC unit 50 indicates an inconclusive or multiple-decoding result. In embodiments in which the inner error correcting code is used for "error floor" scenarios, the inner code decoder rarely needs to be applied, and therefore decoding BCH twice (per code word) creates only a small computational increase.

In the embodiments described above, we generally assume that in the outer code, inverted valid code words are mapped into other valid code words. In other embodiments, in which this property is not guaranteed, decoding schemes similar to those described above for the inner code can be applied for the outer code as well.

Reading Data Stored in the Second Programming Phase

Figure 3A:
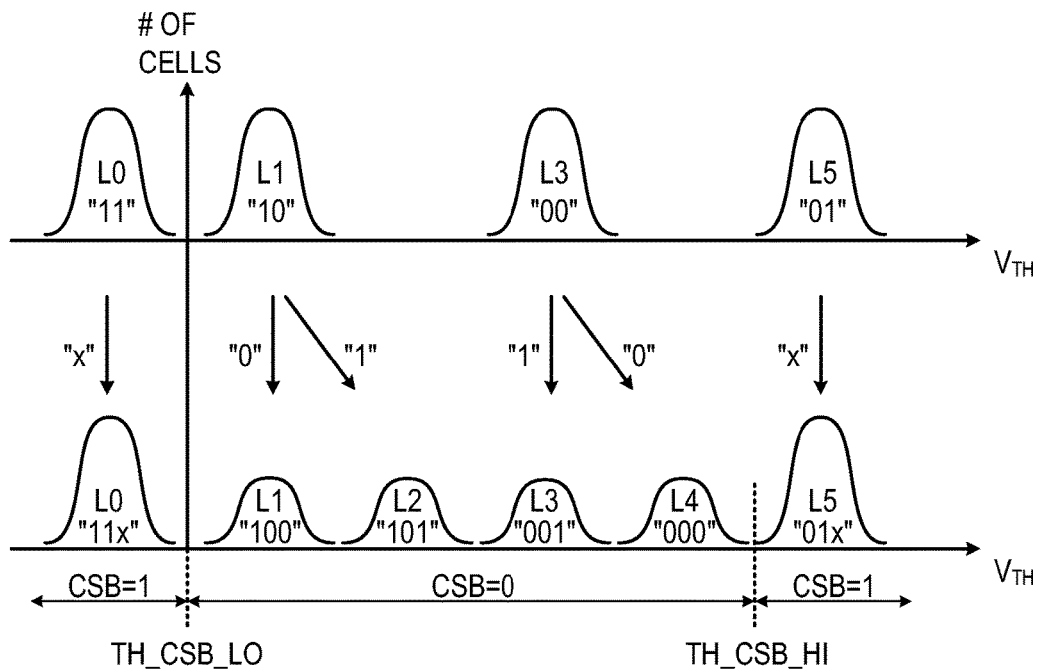
FIGS. 3A and 3B are graphs showing the distribution of programming levels used for storing data with a non-integer number of bits per cell, in accordance with embodiments of the present invention.
Figure 3B:
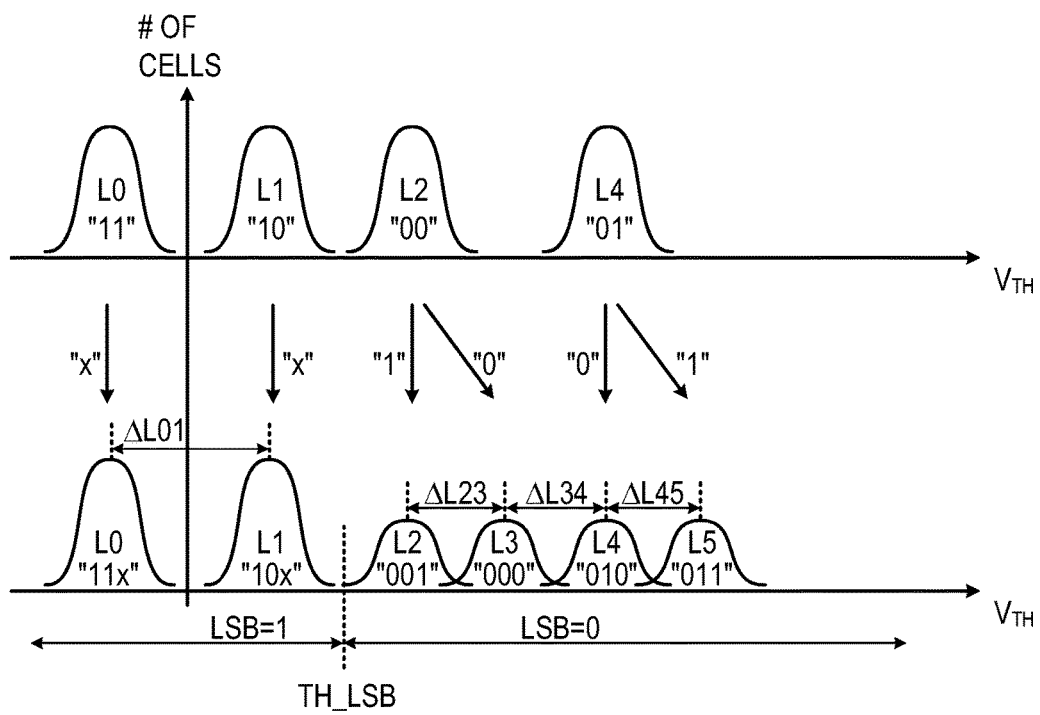

FIGS. 3A and 3B are graphs showing the distribution of programming levels used for storing data with a non-integer number of bits per cell, in accordance with embodiments of the present invention. Each of FIGS. 3A and 3B is divided into upper and lower parts, showing the programming levels and respective cell occupancies after the first and second programming phases, respectively.

In the disclosed embodiments, according to FIGS. 3A and 3B, we assume an underlying TLC device, whose memory cells 32 are programmed in the first phase using four levels, out of which two levels are further split in the second phase. Since each cell stores two bits of information after the first phase, and half of the cells are programed to store an additional bit in the second phase, the device ultimately stores 2.5 bits/cell on average (using six out of the eight TLC levels).

In FIG. 3A, L0, L1, L3, and L5 denote the four levels to which memory cells 32 can be programmed in the first phase. Each of the levels L0, L1, L3, and L5 is mapped to a respective bit-pair combination, i.e., "11", "10", "00", and "01", respectively. In each such bit-pair combination, individual bits correspond to separate data streams or pages. In the description that follows, the left bit corresponds to a LSB page bit, and the right bit to a CSB page bit (i.e., "10" means LSB="1" and CSB="0").

In the second programming phase, only cells that have been programmed in the first phase to level L1 or L3 are further programmed with an additional bit (MSB). Note that since according to the selected bits to level mapping, the CSB bit equals "1" at levels L0 and L5, and "0" at levels L1 and L3, the cells at levels L1 and L3 can be identified by inspecting only the CSB bit. This property also simplifies MSB data reading as explained below.

As shown in FIG. 3A, programming the additional bit splits the population of cells at L1 so that about half of the cells remain at L1 and the remaining half of cells are programmed to L2. Similarly, approximately half the cells at L3 are programmed to L4 whereas the cells of the other half remain unchanged at L3. Thus, cells programmed in the second phase to one of the levels L1, L2, L3, and L4, store three-bit information according to the respective bit assignment "100", "101", "001", or "000". In each such bit-triplet, the left, middle, and right bit corresponds to a respective separate data stream, e.g., a LSB, CSB, or MSB data page. Since the levels L0 and L5 are not programmed in the second phase, the respective bit-triplet assigned to these levels is denoted "11x" or "01x", in which "11" and "01" are the former bit-pair combination (from the first phase) and the rightmost "x" denotes the non-programmed additional bit.

We now describe several methods for reading data stored in a TLC device using the configurations of the programming levels depicted in FIGS. 3A and 3B. As described below, unlike conventional methods in which both the LSB and CSB data should be read in order to identify the cells that were programmed with an additional bit, some of the disclosed methods enable to identify the cells programmed with MSB data by initially reading only the CSB or LSB data.

In an embodiment, with relation to FIG. 3A, to read the MSB page, the storage circuitry first identifies the memory cells that where programed with an additional bit in the second phase, i.e., programmed to levels L1 . . . L4. The storage circuitry first reads, and applies ECC decoding, to each of the LSB and CSB pages, and identifies memory cells that store the bit values "10" or "00" in the leftmost bit-pair of the bit-triples. In another embodiment, the storage circuitry reads and ECC decodes only the CSB data, using the read thresholds TH_CSB LO and TH_CSB_HI (in FIG. 3A) in a single read command. The configuration of programming levels and bits to level mapping as shown in FIG. 3A enables the storage circuitry to refrain from unnecessary operations of read and decode that would result by reading both the LSB and CSB data.

The storage circuitry then identifies the cells whose CSB bit equals "0". To read the data written in the identified cells (e.g., MSB data), the storage circuitry uses, for example, two read thresholds (not shown) so that one threshold is positioned between L1, and L2 and the other threshold between L3 and L4.

In FIG. 3B, the levels L0, L1, L2, and L4 are mapped, in the first phase, to respective bit-pairs "11", "10", "00" and "01". In the second phase, the storage circuitry programs an additional bit only to memory cells that have been programmed in the first phase to L2 or L4. Thus, the level of about half the cells at L2 is shifted to L3, and the level of half the cells at L4 is shifted to L5. The L2, L3, L4, and L5 levels are mapped to respective bit-triples "001", "000", "010", and "011". The levels L0 and L1 are not programmed in the second phase and are mapped to the respective bit-triplets "11x" and "10x".

In some embodiments, similarly to the description in FIG. 3A above, the left, middle, and right bits correspond to respective LSB, CSB, and MSB data pages. In an embodiment, to read the MSB data, the storage circuitry identifies the cells programmed with an additional bit by first reading and decoding only the LSB page (as opposed to read and decode of both the LSB and CSB pages), using a single read threshold denoted TH_LSB in FIG. 3B. This embodiment is advantageous over the one of FIG. 3A above (in which the reading requires two read thresholds), since a larger number of read thresholds typically increases the page reading time. Moreover, similarly to the method of FIG. 3A, only two read thresholds are required for reading the MSB data. The storage circuitry then reads the MSB data from the identified cells using two read thresholds, one positioned between L2 and L3, and the other between L4 and L5. By using the configuration of programming levels and bits to level mapping shown in FIG. 3B, the storage circuitry can efficiently read the MSB page and refrain from unnecessary read and decode operations that would result by reading both the LSB and CSB data.

As can be seen from the description and figures above, programming the additional bit in the second phase typically creates non-uniform cell occupancy among the different levels. For example, the number of cells programmed to each of the levels L2 . . . L5 in FIG. 3B, is about half the number of cells programmed to L0 or L1. As shown in FIG. 3B, the threshold voltage ($V_{TH}$) spacing or separation among the levels and the cell occupancy in each level (among other factors) affect the amount of overlapping between the distributions of adjacent levels. Since this overlapping is closely related to reading error probabilities, uniform spacing among the differently cell-occupied levels may result in non-uniform (and non-optimal) read error probabilities across the levels.

In some embodiments, the threshold voltages assigned to the different programming levels are set so as to achieve uniform read error probabilities across all the levels, based on the cell occupancies of the levels. To compensate for different cell occupancies, the distance (i.e., threshold voltage difference) between adjacent highly populated levels should be set larger than the distance between adjacent less populated levels.

In the example configuration of FIG. 3B, $\Delta L01$ denotes the voltage difference between L0 and L1, and $\Delta L23$, $\Delta L34$, and $\Delta L45$ denote the voltage differences between L2-L3, L3-L4, and L4-L5, respectively. In an embodiment, by adjusting the spacing, based on level occupancy, so that $\Delta L01$ is larger than each of the differences $\Delta L23$, $\Delta L34$, and $\Delta L45$ (which are assumed similar in the present example), the storage circuitry achieves uniform read error probabilities across the programming levels. Additionally, the spacing between L1 and L2, should be configured to be larger than $\Delta L23$, $\Delta L34$, and $\Delta L45$, but smaller than $\Delta L01$.

In some embodiments, the storage circuitry may additionally determine the voltage spacing among the programming levels based on factors other than level occupancies. For example, U.S. Pat. No. 7,925,936, filed Jul. 11, 2008, whose disclosure is incorporated herein by reference, describes several methods for achieving uniform read error probabilities across the programming levels by adjusting the spacing among the levels to compensate for different number of read operations performed in reading pages of different bit significance.

The configurations of FIGS. 3A and 3B are exemplary configurations, which are shown purely for the sake of conceptual clarity and other suitable configurations can also be used. For example, in alternative embodiments, other programming levels, number of levels, level splitting schemes, bits to level mapping, reading thresholds, and/or spacing among the levels can also be used.

Storing Data in the Second Phase at Known Offsets

Consider, for example, storing data in a TLC device using seven programming levels. In some embodiments, the storage circuitry stores the data using suitable variants of the two-phase programming method described above. In an example embodiment, the storage circuitry stores, in the first phase, LSB and CSB data using four levels as shown, for example in the upper part of FIG. 3A. Thus, in the present example, three levels, e.g., L0, L1, and L3 in the upper part of FIG. 3A, are to be split in the second phase.

In some embodiments, the storage circuitry separately encodes data streams denoted LSB, CSB, and MSB data in code words, such as, for example, code word 70. In an embodiment, the storage circuitry programs memory cells 32 in groups of N cells, and also encodes data for storage in N-bit code words as described herein. In the description that follows, the term "cell-group" or just group, refers to a group of N cells that are programmed simultaneously. Note that although we assume that the stored data is subject to ECC encoding in respective code words, the disclosed methods are also applicable to storing raw non-encoded data.

Using four programming levels, the storage circuitry writes (in the first phase) the N-bit LSB and CSB code words. As explained further below, in each cell-group the number of available cells is less than N, but in the first phase, the storage circuitry guarantees that this number exceeds $0.75 \cdot N$ (typically by a small amount). Therefore, although a complete MSB code word cannot be stored in a single cell-group, three N-bit code words can be stored among four cell-groups.

In Table 1 below, we demonstrate a technique for dividing three N-bit code words among four cell-groups. In Table 1, MSB0 . . . MSB2 denote the MSB code words and CW0 . . . CW3 denote the cell-groups. The entries in Table 1 depict the number of bits taken from each code word and written to the available cells in a respective cell-group. For example, $0.25 \cdot N$ bits from MSB0 and $0.5 \cdot N$ bits from MSB1 are programmed in CW1. As another example, the MSB1 bits are divided in half between CW1 and CW2.

TABLE 1

Dividing code words bits among cell-groups

|  | MSB0 | MSB1 | MSB2 |
| --- | --- | --- | --- |
| CW0 | $0.75 \cdot N$ | 0 | 0 |
| CW1 | $0.25 \cdot N$ | $0.5 \cdot N$ | 0 |
| CW2 | 0 | $0.5 \cdot N$ | $0.25 \cdot N$ |
| CW3 | 0 | 0 | $0.75 \cdot N$ |

In some embodiments, if necessary, the storage circuitry preprocesses the data in the first phase by inverting the LSB, CSB, or both code words to guarantee that there are at least $0.75 \cdot N$ cells available for storing the MSB data in the respective cell-group. The group of available cells can be partitioned into two complementary subgroups such that one subgroup comprises $0.75 \cdot N$ cells and the other subgroup comprises the remaining cells, which are referred to as "extra cells." Since the cell occupancies in each of the four levels in the first phase depend on the actual data stored, the number of extra cells is also data dependent.

Various configurations can be used for dividing the bits of three MSB code words among four cell-groups. Table 1 above presents one such example, whereas additional examples are described below. In an embodiment, each code word is divided into two segments, which are stored in two different cell-groups at certain offsets among the available cells. The storage circuitry stores the segments of the code words MSB0 . . . MSB2 continuously among CW0 . . . CW3, using up all the available cells in each cell-group. Let Ni denote the number of available cells in the cell-group CWi, and Ei denote the number of respective extra cells.

In this embodiment, the segments of the code words are stored at variable offsets among the available cells. Note that in the current context, offsets are measured only among the available cells in each cell-group. Thus, for example, zero offset refers to the first available cell in a cell-group. To read a given MSB code word, the storage circuitry needs to evaluate the respective offsets at which the segments were stored, by reading the low significance data from cell-groups in which segments of other code words are stored.

For example, in the present embodiment, the storage circuitry stores $N0=0.75 \cdot N+E0$ of the MSB0 bits in CW0 at zero offset (i.e., first segment), and the remainder of the MSB0 bits (i.e., second segment) in CW1 at zero offset. The storage circuitry then stores the first MSB1 segment in CW1 immediately following the MSB0 second segment, i.e., starting at offset $N-N0=0.25 \cdot N-E0$.

When reading the MSB1 first segment, the storage circuitry should therefore first read and decode the LSB and CSB data stored in CW0, identify and count the number of available cells N0, calculate $E0=N0-0.75 \cdot N$, and use E0 to evaluate the actual offset of the first MSB1 segment (or equivalently calculate N−N0). Similar arguments hold regarding reading the segments of the MSB2 code word. Thus, in this example, reading the MSB1 segments, which are stored in CW1 and CW2, involves reading data stored in another cell-group (i.e., CW0) as well.

In alternative embodiments, which are described below, the storage circuitry stores the MSB segments at known offsets among the available cells. This enables efficient reading of the MSB data, since with known offsets, reading a given MSB code word require reading only data stored in the cell-groups in which the segments of that code word are stored.

FIGS. 4A and 4B are diagrams that schematically illustrate two techniques for storing data at known offsets among available memory cells. Consider writing three N-bit MSB code words denoted MSB0, MSB1, and MSB2, in four cell-groups denoted CW0 . . . CW3. As described above, in the seven-level TLC example, each of the four cell-groups comprises respective number of $Ni=0.75 \cdot N+Ei$ available cells, of which Ei comprise the extra cells.

In FIG. 4A, each code word MSBi (i=0 . . . 3), is divided into two segments denoted MSBi_A and MSBi_B, each having a known predefined size. The MSB0_A segment comprises $0.75 \cdot N$ bits and is stored in CW0 at zero offset. The MSB0_B segment, which comprises $0.25 \cdot N$ bits is stored in CW1 also at zero offset. The MSB1 segment is divided into the MSB1_A and MSB1_B segments, having $0.5 \cdot N$ bits each. The MSB1_A segment is stored in CW1 following the MSB0_B bits, i.e., at a known offset of $0.25 \cdot N$ cells. The MSB1_B segment is stored in CW2 at zero offset, creating a known offset of $0.5 \cdot N$ cells for storing the MSB2_A first segment, which comprises $0.25 \cdot N$ bits. The MSB2_B second segment comprises $0.75 \cdot N$ bits and is stored in CW3 at zero offset. Table 2 summarizes the allocation of the MSB segments among the cell-groups CW0 . . . Cw3 as shown in FIG. 4A.

TABLE 2

Allocating code words at known offsets according to FIG. 4A

| SEGMENT | SEGMENT SIZE | STORED IN CELL-GROUP | OFFSET |
| --- | --- | --- | --- |
| MSB0_A | $0.75 \cdot N$ | CW0 | 0 |
| MSB0_B | $0.25 \cdot N$ | CW1 | 0 |
| MSB1_A | $0.5 \cdot N$ | CW1 | $0.25 \cdot N$ |
| MSB1_B | $0.5 \cdot N$ | CW2 | 0 |
| MSB2_A | $0.25 \cdot N$ | CW2 | $0.5 \cdot N$ |
| MSB2_B | $0.75 \cdot N$ | CW3 | 0 |

In FIG. 4B, the first segment of each MSB code word is written at a known offset, and using up all the available cells.

Remaining bits of the code word (i.e., the second segment) are written in another cell-group at zero offset. Although each MSBi code word is divided into segments MASBi_A and MSBi_B whose size depends on Ei, the segments are still positioned at known fixed offsets. Table 3 summarizes the allocation of the MSB code word segments, among the respective cell-groups according to FIG. 4B.

TABLE 3

Allocating code words among cell-groups according to FIG. 4B

| SEGMENT | SEGMENT SIZE | STORED IN CELL-GROUP, | OFFSET |
|---|---|---|---|
| MSB0_A | $0.75 \cdot N + E0$ | CW0 | 0 |
| MSB0_B | $0.25 \cdot N - E0$ | CW1 | 0 |
| MSB1_A | $0.5 \cdot N + E1$ | CW1 | $0.25 \cdot N$ |
| MSB1_B | $0.5 \cdot N - E1$ | CW2 | 0 |
| MSB2_A | $0.25 \cdot N + E2$ | CW2 | $0.5 \cdot N$ |
| MSB2_B | $0.75 \cdot N - E2$ | CW3 | 0 |

In the embodiments described above, all the code words, including the MSB code words share a common size of N bits. On one hand, this simplifies the encode/decode and write/read operations and related circuitry. On the other hand, however, each N-bit MSB code word needs to be stored in more than a single cell-group as described above. In an alternative embodiment, the MSB code words comprise only $0.75 \cdot N$ bits (referred to as short MSB code words). Since each N-cell group comprises $Ni \geq 0.75 \cdot N$ available cells, short MSB code words always fit in a cell-group. The coding scheme, however, of the short MSB code words is different from the coding scheme of the N-bit code words and should use other partitioning of the data and parity bits. As a result, ECC unit 50 may comprise separate dedicated encoder/decoder for the short MSB code words.

Figure 5:
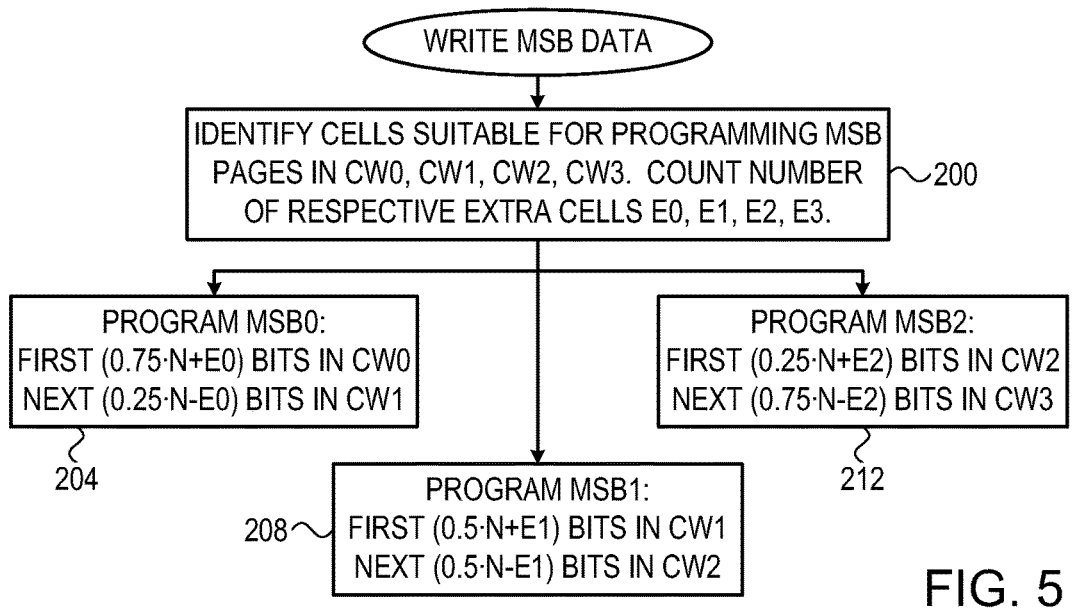
FIG. 5 is a flow chart that schematically illustrates a method for writing data at known offsets among available memory cells, in accordance with an embodiment of the present invention.

FIG. 5 is a flow chart that schematically illustrates a method for writing MSB data at known offsets among available memory cells, in accordance with an embodiment of the present invention. The method in FIG. 5 is aligned with the MSB data allocation among the cell-groups as shown in FIG. 4B. When the method starts, it is assumed that the storage circuitry has already performed the first programming phase, in which the LSB and CSB data are written in CW0 . . . CW3, and that the three code words MB0 . . . MB2 are ready to be programmed. The method begins with the storage circuitry identifying, in each cell-group CWi, the cells that are available for programming MSB data, at a cell identification step 200. Let Ni denote the number of available cells in CWi, and Ei=N−Ni denote the number of respective extra cells. The method then proceeds to a MSB0 programming step 204. At step 204, the storage circuitry programs the first $0.75 \cdot N + E0$ bits of MSB0 in CW0 at zero offset, to use up all the available CW0 cells. The storage circuitry then programs the remaining $0.25 \cdot N \cdot E0$ bits of MB0 is CW1 at zero offset. Next, the storage circuitry programs the MSB1 and MSB2 code words, at respective steps 208 and 212. The storage circuitry writes MSB1 at offset $0.25 \cdot N$ in CW1 and continues in CW2. Similarly, the storage circuitry writes MSB2 in CW2 at offset $0.5 \cdot N$ and the remaining MSB2 bits in CW3 at zero offset.

Figure 6:
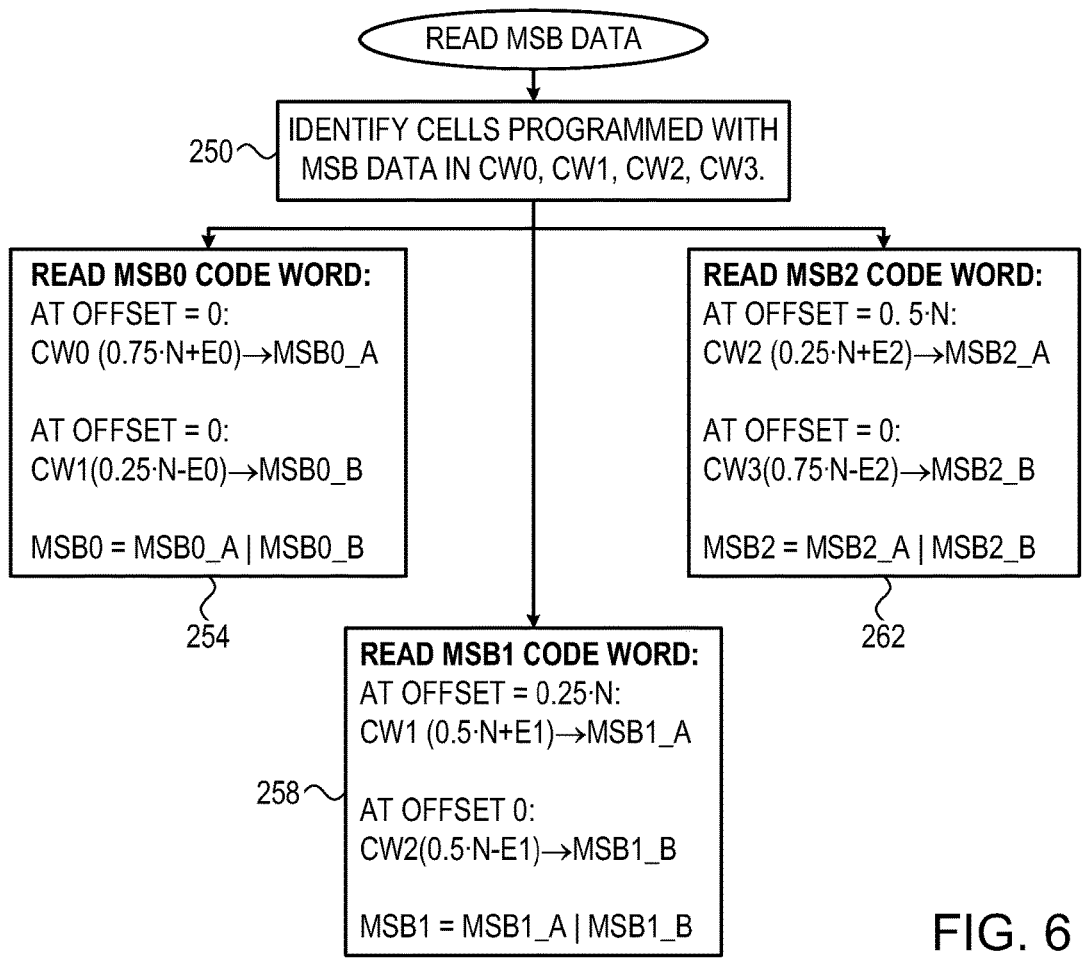
FIG. 6 is a flow chart that schematically illustrates a method for reading data, which was written at known offsets among available memory cells, in accordance with an embodiment of the present invention.

FIG. 6 is a flow chart that schematically illustrates a method for reading MSB data, which was written at known offsets among available memory cells, in accordance with an embodiment of the present invention. The method begins with the storage circuitry identifying cells which are programmed with MSB data at an identifying programmed cells step 250. As evident, for example from Table 3, to independently read only one of the MSB0, MSB1, or MSB2 code words, it is sufficient to identify the cells that are programmed with an additional bit only in {CW0 and CW1}, {CW1 and CW2}, or {CW2 and CW3}, respectively. To read MSB0, MSB1, or MSB2, the storage circuitry proceeds to respective reading step 254, 258, or 262. At step 254, the storage circuitry reads all the available cells in CW0 (i.e., $N0=0.75 \cdot N + E0$ bits) into a temporary segment denoted MSB0_A. The storage circuitry then counts the number of read bits N0, calculates $E0=N0-0.75 \cdot N$, and reads the first $0.25 \cdot N - E0$ bits from the available cells of CW1 into a temporary segment denoted MSB0_B. The storage circuitry then concatenates the two temporary segments to generate the complete MSB0 code word. At reading steps 258 and 262, the storage circuitry similarly reads the MSB1 or MSB2 code words with suitable segment sizes and offsets according to FIG. 4B and Table 3.

The configuration of FIGS. 4A, 4B, 5 and 6 is an exemplary configuration, which is shown purely for the sake of conceptual clarity, and other suitable configurations can also be used. For example, other suitable numbers of code words and cell-groups can also be used. As another example, other ordering schemes of the code words segments among the cell-groups can be selected, such as, for example, swapping between MSB2_A and MBS0_B or MSB1_B.

In the embodiments described in FIGS. 4A, 4B, 5 and 6, during the second phase, the extra cells are typically skipped. In alternative embodiments, however, the storage circuitry can use the extra cells to store user, storage management, and/or any other type of data.

It will be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An apparatus comprising:
    a memory including a plurality of memory cells; and
    a storage circuit configured to:
        store first data into multiple groups of the plurality of memory cells by programming the memory cells in each of the multiple groups to a respective programming level of a set of initial programming levels, wherein each group of the multiple groups includes an initial memory cell;
        identify a plurality of available memory cells in each group that were programmed with the first data to a programming level included in a subset of the set of initial programming levels; and
        store second data into the multiple groups by programming at least one of the identified plurality of available memory cells to a programming level included in an additional set of programming levels that are different from the initial programming levels;

wherein an initial data bit of a particular word of the second data is programmed starting from a fixed offset from the initial memory cell within a respective group.

2. The apparatus of claim 1, wherein the storage circuit is configured to read the particular word by accessing the memory cells at the fixed offset from the initial memory cell within the respective group.

3. The apparatus of claim 1, wherein the fixed offset is different between two groups of the multiple groups of the plurality of memory cells.

4. The apparatus of claim 1, wherein the second data comprises multiple words, and wherein a size of each word is larger than an actual number of the plurality of available memory cells in each of the multiple groups.

5. The apparatus of claim 4, wherein the storage circuit is configured to read the particular word by reading the first data only from one or more groups of the memory cells in which the particular word was programmed.

6. The apparatus of claim 1, wherein the storage circuit is configured to program a subset of the plurality of available memory cells in each group with third data, in response to a determination that the subset of the plurality of available memory cells was not programmed with the second data.

7. The apparatus of claim 1, wherein the second data comprises multiple data words whose data-word size does not exceed a number of available memory cells in each of the multiple groups of the plurality of memory cells.

8. A method for data storage, comprising:
storing, by a storage circuit, first data into multiple groups of a plurality of memory cells by programming memory cells in each of the multiple groups to a respective programming level of a set of initial programming levels, wherein each group of the multiple groups includes an initial memory cell;
identifying a plurality of available memory cells in each group that were programmed with the first data to a programming level included in a subset of the set of initial programming levels; and
storing, by the storage circuit, second data into the multiple groups by programming at least one of the identified plurality of available memory cells to a programming level included in an additional set of programming levels, different from the initial programming levels;
wherein an initial data bit of a particular word of the second data is programmed starting from a fixed offset from the initial memory cell within a respective group.

9. The method of claim 8, and comprising reading the particular word by accessing the memory cells at the fixed offset from the initial memory cell within the respective group.

10. The method of claim 8, wherein the fixed offset is different between two groups of the multiple groups of the plurality of memory cells.

11. The method of claim 10, wherein the second data comprises multiple data words, and wherein a size of each data word is larger than an actual number of the plurality of available memory cells in each of the multiple groups.

12. The method of claim 10, wherein reading the second data comprises reading the particular word by reading the first data only from one or more groups of the memory cells in which the particular word was programmed.

13. The method of claim 8, further comprising when programming a subset of the plurality of available memory cells in each group with third data, in response to determining that the subset of the plurality of available memory cells was not programmed with the second data.

14. The method of claim 8, wherein the second data comprises multiple data words whose data-word size does not exceed a number of available memory cells in each of the multiple groups of the plurality of memory cells.

15. A system comprising:
a memory including a plurality of memory cells;
an interface to the memory; and
a memory controller, coupled to the interface and configured to:
store, via the interface, first data into multiple groups of the plurality of memory cells by programming the memory cells in each of the multiple groups to a respective programming level of a set of initial programming levels, wherein each group of the multiple groups includes an initial memory cell;
identify a plurality of available memory cells in each group that were programmed with the first data to a programming level included in a subset of the set of initial programming levels; and
store, via the interface, second data into the multiple groups by programming at least one of the identified plurality of available memory cells to a programming level included in an additional set of programming levels, different from the initial programming levels;
wherein an initial data bit of a particular word of the second data is programmed starting from a fixed offset from the initial memory cell within a respective group.

16. The system of claim 15, wherein the memory controller is configured to read the particular word by accessing the memory cells at the fixed offset from the initial memory cell within the respective group.

17. The system of claim 15, wherein the fixed offset is different between two groups of the multiple groups of the plurality of memory cells.

18. The system of claim 15, wherein the second data comprises multiple words, and wherein a size of each word is larger than an actual number of the plurality of available memory cells in each of the multiple groups.

19. The system of claim 18, wherein the memory controller is configured to read the particular word by reading the first data only from one or more groups of the memory cells in which the particular word was programmed.

20. The system of claim 15, wherein the memory controller is configured to program a subset of the plurality of available memory cells in each group with third data, in response to a determination that the subset of the plurality of available memory cells was not programmed with the second data.

* * * * *